United States Patent
Sugai et al.

(10) Patent No.: US 7,632,704 B2
(45) Date of Patent: Dec. 15, 2009

(54) MANUFACTURING METHOD FOR ORGANIC ELECTRONIC ELEMENT AND MANUFACTURING APPARATUS THEREFOR

(75) Inventors: Hiroshi Sugai, Funabashi (JP); Masahiro Kanai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 135 days.

(21) Appl. No.: 11/105,498

(22) Filed: Apr. 14, 2005

(65) Prior Publication Data

US 2005/0239232 A1   Oct. 27, 2005

(30) Foreign Application Priority Data

Apr. 22, 2004 (JP) .................... 2004-126561
Mar. 2, 2005 (JP) .................... 2005-057445

(51) Int. Cl.
*H01L 51/56* (2006.01)
*C23C 16/00* (2006.01)

(52) U.S. Cl. .......... 438/99; 257/E51.018; 427/66; 118/731

(58) Field of Classification Search ............ 257/40, 257/E51.001–E51.052; 438/99; 118/731; 204/192.14; 427/66, 255.5
See application file for complete search history.

(56) References Cited

U.S. PATENT DOCUMENTS

| | | | |
|---|---|---|---|
| 5,863,338 A * | 1/1999 | Yamada et al. | 118/719 |
| 6,179,923 B1 * | 1/2001 | Yamamoto et al. | 118/719 |
| 6,641,933 B1 * | 11/2003 | Yamazaki et al. | 428/690 |
| 6,736,985 B1 * | 5/2004 | Bao et al. | 216/13 |
| 2002/0179013 A1 * | 12/2002 | Kido et al. | 118/718 |
| 2003/0020181 A1 * | 1/2003 | Yamada | 257/787 |
| 2003/0122140 A1 * | 7/2003 | Yamazaki et al. | 257/88 |
| 2003/0132703 A1 * | 7/2003 | Sakaguchi | 313/504 |
| 2003/0146692 A1 * | 8/2003 | Uchida | 313/504 |
| 2003/0194497 A1 * | 10/2003 | Takada et al. | 427/355 |
| 2003/0196597 A1 * | 10/2003 | Yamazaki et al. | 118/300 |
| 2003/0228715 A1 * | 12/2003 | Brody et al. | 438/30 |
| 2004/0147113 A1 * | 7/2004 | Yamazaki et al. | 438/660 |
| 2004/0159285 A1 * | 8/2004 | Doehler et al. | 118/718 |
| 2004/0194821 A1 * | 10/2004 | Chittibabu et al. | 136/263 |
| 2004/0201027 A1 * | 10/2004 | Ghosh | 257/99 |
| 2004/0212599 A1 * | 10/2004 | Cok et al. | 345/173 |
| 2004/0222737 A1 * | 11/2004 | Raychaudhuri et al. | 313/504 |

(Continued)

FOREIGN PATENT DOCUMENTS

JP   08-111285   4/1996

(Continued)

OTHER PUBLICATIONS

Machine Translation of JP 10261487 A.*

(Continued)

*Primary Examiner*—Douglas M Menz
*Assistant Examiner*—Matthew W Such
(74) *Attorney, Agent, or Firm*—Fitzpatrick, Cella, Harper & Scinto

(57) ABSTRACT

Provided are a method of effectively manufacturing an organic EL element with high quality and an apparatus therefor. A surface to be processed of a substrate in an upper electrode forming step is held downward, and the surface to be processed of the substrate in a passivation layer forming step is held upward.

4 Claims, 1 Drawing Sheet

U.S. PATENT DOCUMENTS

2004/0238104 A1* 12/2004 Suzuki et al. ............... 156/163
2005/0016462 A1* 1/2005 Yamazaki ................... 118/726
2005/0088079 A1* 4/2005 Daniels ...................... 313/504
2005/0106986 A1* 5/2005 Cok et al. .................... 445/58

FOREIGN PATENT DOCUMENTS

| | | |
|---|---|---|
| JP | 08-111286 | 4/1996 |
| JP | 08111285 A * | 4/1996 |
| JP | 10261487 A * | 9/1998 |
| JP | 2002-117973 | 4/2002 |
| JP | 2002117973 A * | 4/2002 |
| JP | 2003-208978 | 7/2003 |
| JP | 2004-047179 | 2/2004 |

OTHER PUBLICATIONS

Machine Translation of JP 2002117973 A.*
Machine Translation of JP 08111285 A.*

* cited by examiner

MANUFACTURING METHOD FOR ORGANIC ELECTRONIC ELEMENT AND MANUFACTURING APPARATUS THEREFOR

BACKGROUND OF THE INVENTION

1. Field of the Invention

The present invention relates to a manufacturing method for an organic electronic element and a manufacturing apparatus therefor. More specifically, the present invention relates to a manufacturing method for an organic electroluminescence element (organic EL element) and a manufacturing apparatus therefor.

2. Related Background Art

Organic electronic elements such as organic EL elements have been developed prosperously. In Japanese Patent Application Laid-Open No. H08-111285, contamination constituents such as moisture and oxygen in an atmosphere contaminate elements under formation due to intervention of the atmosphere, which leads to deterioration of characteristics of the elements. With the aim for performing a thin film forming process throughout, as a method for solving this problem, a method has been tried in which: one vacuum conveying vessel is located at the center; plural vacuum depositing vessels are arranged therearound; a substrate is delivered while spaces among the vessels are kept in a vacuum state, thereby performing vapor deposition successively.

It is described in Japanese Patent Application Laid-Open No. 2002-117973, p. 7, that a plasma CVD method is preferable to a sputtering method in the formation of an inorganic protective film. Further, it is described that: an area for temporarily storing a substrate, which waits to be subjected to plasma CVD treatment, is provided; after being stored in the storage area, a specific number of the substrates are collectively carried in a plasma CVD device; and the inorganic protective film is formed on the substrates at once.

The inventors of the present invention have noticed that it is important that a way of holding a substrate is optimized in each of a step of forming an upper electrode and a step of forming a passivation layer.

The reason for this is that the inventors consider that it is important for performance of an organic electronic element that: an undesired substance is prevented from adhering onto a substrate in the upper electrode formation; and a thickness of a substrate surface is made uniform in the passivation layer formation.

SUMMARY OF THE INVENTION

The present invention has been made in view of the above, and therefore has an object to provide a manufacturing method for an organic electronic element in which: an undesired substance is prevented from adhering onto a substrate in the formation of an upper electrode; and a thickness of a substrate surface is made uniform in the formation of a passivation layer, and a manufacturing apparatus therefor.

According to one aspect of the present invention, there is provided a manufacturing method for an organic electronic element, including the steps of:

forming an organic conductive layer on a lower electrode arranged on a substrate;

forming an upper electrode after the organic conductive layer forming step; and forming a passivation layer after the upper electrode forming step, in which:

a surface to be processed of the substrate in the upper electrode forming step is held downward; and the surface to be processed of the substrate in the passivation layer forming step is held upward.

In further aspect of the manufacturing method for an organic electronic element, the number of the substrates which are processed in the passivation layer forming step, is larger than the number of the substrates which are processed in the upper electrode forming step.

In further aspect of the manufacturing method for an organic electronic element, the upper electrode forming step is a step of forming the upper electrode through sputtering of a transparent electrode material.

In further aspect of the manufacturing method for an organic electronic element, the passivation layer forming step is a step of forming the passivation layer by a CVD method.

In further aspect of the manufacturing method for an organic electronic element, in the passivation layer forming step, a back surface of the surface to be processed of the substrate is placed on a surface of a placing base.

In further aspect of the manufacturing method for an organic electronic element, the substrate is processed without being exposed to outside air from the upper electrode forming step through the passivation layer forming step.

In further aspect of the manufacturing method for an organic electronic element, the method further includes the step of making the substrate stand-by for the passivation layer forming step together with other substrates between the upper electrode forming step and the passivation layer forming step.

In further aspect of the manufacturing method for an organic electronic element, the organic electronic element is an organic electroluminescence element.

According to another aspect of the present invention, there is provided a manufacturing method for a display, including the step of forming an image display portion, in which the organic electroluminescence element is formed as an image display portion.

According to another aspect of the present invention, there is provided a manufacturing apparatus of an organic electronic element, including:

means for forming an organic conductive layer on a lower electrode arranged on a substrate;

means for forming an upper electrode; and means for forming a passivation layer, in which:

the upper electrode forming means includes means for holding a surface to be processed of the substrate downward; and the passivation layer forming means includes means for holding the surface to be processed of the substrate upward.

In further aspect of the manufacturing apparatus of an organic electronic element, the passivation layer forming means includes means for placing substrates to collectively process a larger number of the substrates than that with the upper electrode forming means.

In further aspect of the manufacturing apparatus of an organic electronic element, the upper electrode forming means includes means for sputtering a transparent electrode material to form the upper electrode.

In further aspect of the manufacturing apparatus of an organic electronic element, the passivation layer forming means includes means for forming the passivation layer by a CVD method.

In further aspect of the manufacturing apparatus of an organic electronic element, the passivation layer forming means includes a placing base on which a back surface of the surface to be processed of the substrate is placed.

In further aspect of the manufacturing apparatus of an organic electronic element, an outside air shielding means, with which the substrate is conveyed without being exposed to outside air, is provided between the upper electrode forming means and the passivation layer forming means.

In further aspect of the manufacturing apparatus of an organic electronic element, the apparatus further includes a stand-by chamber in which the substrate stands by with other substrates before being conveyed to the passivation layer forming means.

In further aspect of the manufacturing apparatus of an organic electronic element, the organic electronic element is an organic electroluminescence element.

In further aspect of the manufacturing apparatus, the organic electroluminescence element is an image display portion of a display.

According to the present invention, there can be provided the manufacturing method for the organic electronic element in which: the undesired substance is prevented from adhering onto the substrate in the formation of the upper electrode; and the thickness of the substrate surface is made uniform in the formation of the passivation layer, and the manufacturing apparatus therefor.

DESCRIPTION OF THE PREFERRED EMBODIMENTS

Figure 1:
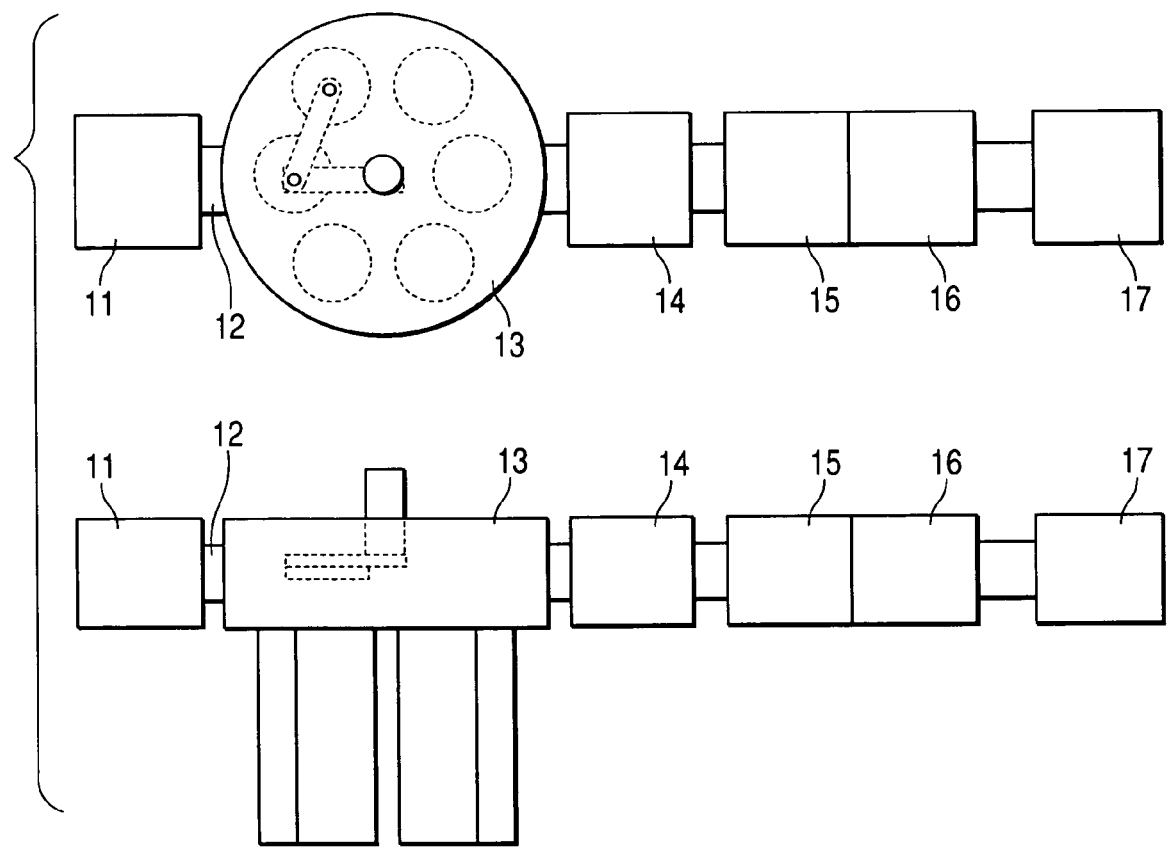
FIG. 1 is a schematic diagram showing an example of an organic EL manufacturing apparatus in accordance with an embodiment of the present invention.

In a manufacturing method for an organic electronic device according to this embodiment, a surface to be processed of a substrate in an upper electrode forming step is held downward, and the surface to be processed of the substrate in a passivation layer forming step is held upward.

As to the resultant organic electronic element, an undesired substance does not adhere to a substrate in the upper electrode formation, and a thickness of a substrate surface is uniform in the passivation layer.

In this embodiment, an organic EL element is given as an example. In the organic EL element, a lower electrode is provided on a substrate, an upper electrode is arranged so as to oppose the lower electrode, and an organic conductive layer is arranged between the electrodes. A passivation layer (protective film) is arranged so as to cover the lower electrode, organic conductive layer, and upper electrode.

Note that the present invention can be also applied to, for example, an organic FET in which a semiconductor portion consists of an organic conductive layer. In this case, the lower electrode corresponds to a gate electrode, and the upper electrode corresponds to either a source electrode or a drain electrode. Alternatively, it can be adopted that the lower electrode corresponds to either the source electrode or the drain electrode, and the upper electrode corresponds to the gate electrode. Hereinafter, description will be made with the organic EL element as an example.

It is preferable that the number of substrates which are processed in a passivation layer forming step be larger than the number of substrates which are processed in an upper electrode forming step. This is the passivation layer is formed thicker than the upper electrode, and the time required for the formation of the passivation layer is longer than the time required for the formation of the upper electrode.

The upper electrode forming step is preferably performed by sputtering. More specifically, it is preferable that the upper electrode forming step be achieved through sputtering of a transparent electrode material. The transparent electrode material is a material called, for example, ITO or IZO. In this case, the upper electrode can be used as an electrode on the side for taking out light of the organic EL element.

The passivation layer forming step is preferably a step of forming a passivation layer through CVD. CVD is preferable because the passivation layer with a uniform thickness can be formed to many substrates at once. The passivation layer consists of, for example, an inorganic protective film. More specifically, the layer is composed of a film containing Si or N as its main constituent. CVD is preferably used in the case of forming the inorganic protective film.

In the passivation layer forming step, it is preferable that a back surface of a surface to be processed of a substrate be placed on a surface of a placing base provided in a passivation layer forming means. The surface to be processed indicates, among surfaces of the substrate, a surface in which: the lower electrode is arranged thereon; the organic conductive layer is arranged thereon; and the upper electrode is arranged thereon, in the case of the organic EL element. The back surface of the surface to be processed is preferably placed on the placing base. When the substrate is placed in this way, differently from the case where the substrate is held only at a side portion thereof, the entire back surface is supported. Thus, deflection of the substrate can be avoided. As a result, the passivation layer in the substrate surface can be made uniform.

It is preferable that the substrate be processed without being exposed to the air from the upper electrode forming step through the passivation layer forming step. As a result, the organic electronic element (for example, organic EL element) can be protected against moisture and oxygen in the air. In this case, the means for forming the upper electrode may be connected to the means for forming the passivation layer through a shutter or the like. Decompression pumps may be provided in both the means respectively. Also, both the means may have a chamber having a sputtering means and a chamber in which a CVD method can be performed respectively.

It is preferable that a stand-by step of making a substrate stand by for the passivation layer forming step together with other substrates be provided between the upper electrode forming step and the passivation layer forming step. As a result, there can be avoided that limitation on a processing speed caused by the difference between the tact times in both the steps.

A more specific case indicates a case where the time required for the passivation layer forming step is longer than the time required for the upper electrode forming step. In such a case, for example, a separate chamber is provided in the midway of a path for conveying a substrate from the upper electrode forming means to the passivation layer forming means; the substrate, which has been processed by the upper electrode forming means, is made to stand by in the chamber; the number of substrates, which have been subsequently processed, reaches the predetermined number; and then, plural substrates are conveyed to the passivation layer forming means to be processed at once. Alternatively, for example, a separate chamber is provided in the midway of a path for conveying a substrate from the upper electrode forming means to the passivation layer forming means; the substrate, which has been processed by the upper electrode forming means, is made to stand by in the chamber; the substrate is made to stand by together with the substrates, which have been subsequently processed; the substrates are conveyed to the passivation layer forming means when the means is ready;

and the plural substrates can be processed at once by the passivation layer forming means.

It is sufficient that the separate chamber is any chamber as long as the substrate can be made to stand by in the chamber. It is further sufficient that the substrate can be protected against oxygen and moisture. The separate chamber may be a type of chambers in the passivation layer forming means which are arranged in the plural number.

The organic electronic element can be manufactured by the above-described method, and the manufacturing method can be applied to an organic electroluminescence element as the organic electronic element. In this case, the organic EL element can be used for an image display portion of a display. The display can be obtained by a manufacturing method for a display which includes the step of forming an image display portion, in which the organic EL element is formed as the image display portion.

Next, description will be further made in detail with reference to the accompanying drawings.

FIG. 1 is a schematic structural view showing an organic EL manufacturing apparatus in accordance with the embodiment of the present invention. In FIG. 1, reference numeral 11 denotes a loading chamber; 12, conveying path; 13, vapor depositing device; 14, transparent conductive film forming means as an upper electrode forming means; 15, substrate inverting machine; 16, passivation layer forming means; and 17, unloading chamber.

The loading chamber 11 has a function of substituting a pressure in the chamber by an atmospheric pressure with an inert gas at a dew-point temperature of −80° C. When a substrate is loaded into the chamber, the chamber is subjected to vacuum exhaust to obtain a pressure of about 0.1 Pa by means of a vacuum pump. Next, the substrate is conveyed to the vapor depositing device 13 via the conveying path 12. Subsequently, after having been subjected to one step, the substrate is conveyed to the next step via the conveying path. The substrate is isolated from an atmosphere until the final passivation layer is formed. Accordingly, high quality in the respective steps is secured.

In a vapor depositing step, exhaust is performed to obtain a pressure of about $1 \times 10^{-5}$ Pa, and organic EL materials (organic conductive layers) for a hole transport layer, light emission layer, electron transport layer, and electron injection layer are deposited on the substrate. Usually, the thickness of the hole transport layer is 30 to 100 nm, the thickness of the light emission layer is 30 to 100 nm, and the thickness of each of the electron transport layer and the electron injection layer is 10 to 40 nm. Vapor deposition is performed at an organic vapor deposition speed of 0.5 to 1.5 nm/s for each layer. The organic conductive layers are processed at one time in the vapor depositing step. Thus, the tact time for the vapor depositing step is within several minutes.

Further, the substrate is conveyed to the transparent conductive film forming means 14 via the conveying path, and a transparent conductive film is formed at a pressure of about 0.1 Pa. The thickness of the transparent conductive film is usually 100 to 300 nm, and a deposition speed thereof is 1 to 2 nm/s. Thus, the tact time for the transparent conductive film forming step is within several minutes. The steps through this step are performed with a system in which particles for forming a deposition film head for an upper side from a lower side. That is, a surface to be processed of the substrate is directed to the lower side.

This is because it is utilized that the material diffuses from the lower side to the upper side in the organic material vapor depositing step, which provides high utilization efficiency of the material.

In the transparent conductive film forming step, the surface to be processed of the substrate is directed to the lower side in order to prevent a foreign matter from falling and adhering to the surface to be processed in the film formation. The foreign matter indicates, for example, a sputtering material, which adheres to the inside of the chamber or the like.

Note that the number of substrates which are processed in the transparent conductive film forming step as the upper electrode forming step, is not necessarily one.

Then, the substrate is conveyed to the inverting machine 15, which has been exhausted to a pressure of about 10 Pa, via the conveying path 12, and plural substrates are put therein through vertical inversion. The plural substrates constituting one unit are conveyed to the passivation layer forming means 16, and a passivation layer is formed at about 100 Pa (passivation layer forming step). The passivation layer usually has a thickness of 100 to 1,000 nm, and is formed at a deposition speed of 0.5 to 2 nm/s. Thus, the tact time about ten times that in the other step is required. The plural substrates inverted by the inverting machine are mounted on a base holder (not shown in the figure) with rigidity, and are collectively processed in the passivation layer forming step. Thus, the tact times for the entire device are conformed to one another, which improves productivity. Further, the back surfaces of the plural substrates are placed onto a surface of a not-shown placing base provided in the chamber of the passivation layer forming means, and therefore, the substrates can be stably subjected to film deposition without deflection.

That is, the number of substrates which are processed by the passivation layer forming means, is larger than the number of substrates (which is not limited to one), which are processed by the upper electrode forming means.

This indicates that a small number of substrates can be processed in the steps before the passivation layer forming step. As a result, the structure of the entire device is simple, and a vacuum exhaust time and a manufacturing cost can be reduced.

Further, in the case where a distribution of a film deposition area occurs depending on the size of a substrate, plural passivation layer forming steps can be performed with the respective set numbers of substrates to be processed.

The substrate, which has been subjected to the passivation step, is conveyed to the unloading chamber via the conveying path 12, and then is taken out as an organic EL element into the atmosphere.

Hereinafter, there are shown examples of a deposited film forming apparatus according to the present invention. However, the present invention is not limited by the following examples.

EXAMPLE 1

An example is shown below in which an organic EL element is manufactured by using the organic EL manufacturing apparatus in FIG. 1. A TFT driving circuit is patterned to be arranged on a substrate 2 inches square. The substrate was loaded into the loading chamber 11, and was conveyed to the vapor depositing device 13 via the conveying path 12.

Here, the organic EL element was manufactured on the TFT substrate with the use of the following known materials. That is, the TFT substrate, on which Cr was arranged as a first electrode, was subjected to UV/ozone cleaning treatment. Then, an organic light emission layer, which was comprised of a hole transport layer, light emission layer, electron transport layer, and electron injection layer, was formed thereon by a vacuum deposition method by using the following materials.

For the hole transport layer, αNPD expressed by Chemical Formula 1:

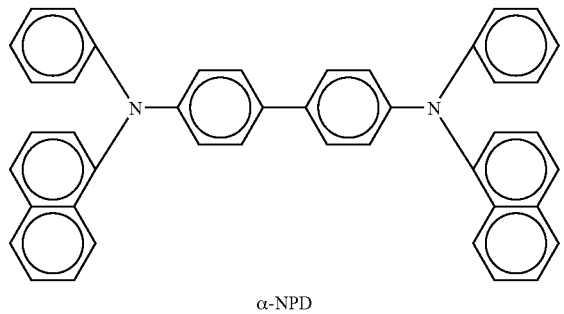

α-NPD was deposited with a thickness of 50 nm.

For the light emission layer, an aluminum chelate complex (Alq$_3$) expressed by Chemical Formula 2:

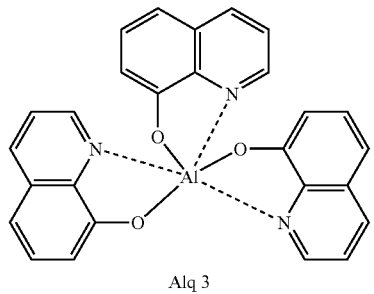

Alq 3 and Coumarin6 expressed by Chemical Formula 3:

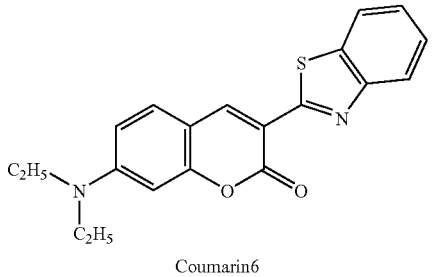

Coumarin6 were co-evaporated with a weight ratio of 100:6 to have a thickness of 50 nm.

For the electron transport layer, a phenanthroline compound expressed by Chemical Formula 4:

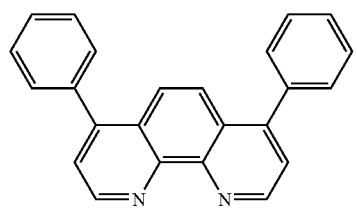

was deposited with a thickness of 10 nm.

Further, for the electron injection layer, the phenanthroline compound and cesium carbonate $Cs_2CO_3$ were co-evaporated with a weight ratio of 100:1 to have a thickness of 40 nm.

Those vapor depositing steps were performed at about 1 nm/s. Thus, the substrate was able to be conveyed to the next step with a tact time of 80 seconds.

Next, two substrates were conveyed to the transparent conductive film forming means 14, which is the upper electrode forming means. A second electrode composed of an ITO film was deposited on the substrates at once with a thickness of 220 nm by a sputtering method. The two substrates each having pixels corresponding to the respective TFTs were thus obtained with a tact time of 80 seconds. Thereafter, the two substrates making one pair were conveyed to the next step.

Next, the substrate was conveyed to the inverting machine 15, and was inverted to be arranged on the substrate holder. In the state of being arranged on the substrate holder, the substrate was made to stand by until the passivation layer forming step started while waiting other plural pairs of substrates, which were to be subsequently arranged on the substrate holder.

At the point of time when ten substrates were arranged on the substrate holder, the ten substrates as one unit were collectively conveyed to the passivation layer forming means 16 for performing the passivation layer forming step. Then, a passivation layer was formed with a thickness of 700 nm by a PE-CVD method. The passivation layer was formed at a substrate temperature of 60° C. or lower under conditions of an $SiH_4$ gas of 4 sccm, an $N_2$ gas of 200 sccm, a high frequency power of 40 W, and a pressure of 70 Pa. The resultant products were conveyed to the unloading chamber 17 with a tact time of 80 seconds. Subsequently, the products were able to be exhausted to the outside of the manufacturing apparatus with a tact time of 80 seconds per unit composed of ten substrates.

The manufactured products each had a thickness distribution of ±3%. The products were subjected to an endurance test against isothermy and high humidity with a temperature of 60° C. and humidity of 90%. In the test, the products were made to emit light after a constant time, and the number of dark spots was measured. As a result, no dark spot was detected until an endurance time against isothermy and high humidity of 500 hours passed.

As to the thickness of the passivation layer, the thickness values at ten points, which were arbitrarily selected on one substrate surface, were measured. The average value of the maximum thickness and the minimum thickness was taken as the thickness of the passivation layer of the substrate. Then, the thickness distribution was obtained by comparing the average thicknesses of the substrates.

EXAMPLE 2

The number of substrates, which were processed at one time in the passivation layer forming step, was set to one. The other points are the same as those in Example 1. It took a tact time of 800 seconds (tact time of 80 seconds×10=tact time of 800 seconds) until the passivation layer forming step was completed with respect to ten substrates. The detection results of the thickness distribution and the dark spot are the same as in Example 1. However, the tact time about ten times that in Example 1 was required.

COMPARATIVE EXAMPLE 1

The substrates, on which the organic conductive layers and transparent electrode layers were formed respectively by the same method as in Example 1, were not inverted and were formed with the same passivation layer as in Example 1 while each having a deposition surface downward by 10 pieces. The substrates in the unit were exhausted with a tact time of about 80 seconds. However, the thus manufactured products each had a thickness distribution exceeding ±5% because the substrate surfaces were not kept horizontally. The products were subjected to the endurance test against isothermy and high humidity with a temperature of 60° C. and humidity of 90%. In the test, the products were made to emit light after a constant time, and the number of dark spots was measured. As a result, no dark spot was detected until an endurance time against isothermy and high humidity of 500 hours passed.

COMPARATIVE EXAMPLE 2

The substrates, on which the layers through the organic conductive layers were formed respectively by the same method as in Example 1, were inverted and each had a deposition surface upward. The transparent electrode film as in Example 1 was deposited to the substrates in a set of 2, and the passivation layer as in Example 1 was deposited to the substrates in a set of 10. The substrates in the unit were exhausted with a tact time of about 800 seconds. The manufactured products each had a thickness distribution of ±3%. The products were subjected to the endurance test against isothermy and high humidity with a temperature of 60° C. and humidity of 90%. In the test, the products were made to emit light after a constant time, and the number of dark spots was measured. As a result, the dark spot was detected after an endurance time against isothermy and high humidity of 100 hours. This is presumably influenced by the fall of a foreign matter in the transparent electrode layer forming step.

The results in Examples 1 and 2 and Comparative Examples 1 and 2 are shown in Table 1.

Next, the substrate was conveyed to a transparent conductive film forming means 24, and here, a transparent conductive film was formed as in Example 1. Next, the substrate was conveyed to an inverting machine 25, and was inverted to be arranged on the substrate holder. The steps through this step were repeated, and the initial substrates were taken as a unit of 5. The substrates in the unit were conveyed to a passivation layer forming means 26.1, and a passivation layer was formed to the substrates. The subsequent five substrates as a unit were conveyed to a passivation layer forming means 26.2, and a passivation layer was formed to the substrates as in Example 1. After the formation of the passivation layer, the substrates were conveyed to an unloading chamber 27. Subsequently, the substrates in the unit were able to be exhausted with a tact time of 80 seconds.

The thus manufactured products each had a thickness distribution of ±3%. The products were subjected to the endurance test against isothermy and high humidity with a temperature of 60° C. and humidity of 90%. In the test, the products were made to emit light after a constant time, and the number of dark spots was measured. As a result, no dark spot was detected until an endurance time against isothermy and high humidity of 500 hours passed.

This application claims priority from Japanese Patent Application No. 2004-126561 filed on Apr. 22, 2004 and Japanese Patent Application No. 2005-057445 filed on Mar. 2, 2005, which are hereby incorporated by reference herein.

What is claimed is:

1. A manufacturing method for an organic electronic element, comprising the steps of:

(a) forming an organic conductive layer on a lower electrode arranged on a substrate with a vacuum vapor deposition apparatus while holding a surface of the substrate on which the organic conductive layer is formed downward;

(b) forming an upper electrode on the organic conductive layer with a sputtering apparatus while holding the surface of the substrate on which the upper electrode is formed downward;

(c) inverting the substrate on which the upper electrode has been formed such that the surface to be processed is held upward in a stand-by chamber where moisture content is

TABLE 1

| | Direction of Surface to be Processed of Substrate in Each Step | | | Number of Substrates which | | | |
| --- | --- | --- | --- | --- | --- | --- | --- |
| | Organic Layer Forming Step | Upper Electrode Forming Step | PV Film Forming Step | can be Processed at Once in PV Film Forming Step | Tact Time (sec/substrate) | Endurance Evaluation | Thickness Distribution |
| Example 1 | Downward | Downward | Upward | 10 | 80 | No abnormality | ±3% |
| Example 2 | Downward | Downward | Upward | 1 | 800 | No abnormality | ±3% |
| Comparative Example 1 | Downward | Downward | Downward | 10 | 80 | No abnormality | ±5% |
| Comparative Example 2 | Downward | Upward | Upward | 10 | 80 | DS | ±3% |

"PV": passivation
"DS": The occurrence of dark spots was observed after an endurance test time of 100 hours.

EXAMPLE 3

Figure 2:
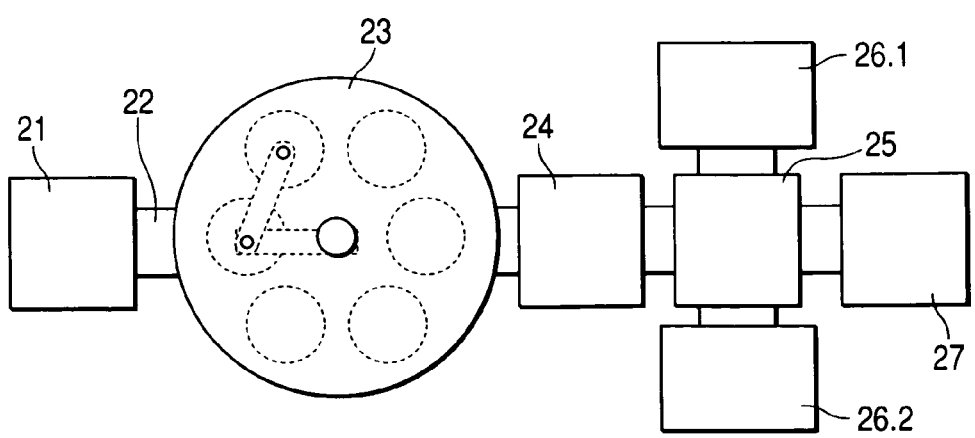
FIG. 2 is a schematic diagram showing another organic EL manufacturing apparatus in accordance with the embodiment of the present invention.

An example is shown below in which an organic EL element was manufactured by using an organic EL manufacturing apparatus in FIG. 2.

A substrate 5 inches square, on which a TFT driving circuit had been patterned, was loaded into a loading chamber 21, and then was conveyed to a vapor depositing device 23 via a conveying path 22. Here, an organic conductive layer was deposited onto the substrate as in Example 1.

controlled to arrange the substrate on a substrate holder of a chemical vapor deposition apparatus;

(d) repeating steps (a)-(c) on at least one additional substrate and placing each substrate on the substrate holder until a predetermined number of processed substrates is reached;

(e) conveying the predetermined number of processed substrates to the chemical vapor deposition apparatus; and (f) forming passivation films collectively, each of which comprises Si and N as a main component, on the predetermined number of processed substrates, wherein time required for forming the passivation layer is longer than time required for forming the upper electrode;

the predetermined number of processed substrates is larger than number of the substrates which are individually processed in the step of forming the upper electrode;

the stand-by chamber is a separate chamber different from a space for conducting the step of forming the upper electrode and the chemical vapor deposition apparatus; and the substrates are not exposed to air from the step of forming the organic conductive layer to the step of forming the passivation film.

2. The manufacturing method for an organic electronic element according to claim 1, wherein the upper electrode forming step comprises a step of forming the upper electrode through sputtering of a transparent electrode material.

3. The manufacturing method for an organic electronic element according to claim 1, wherein the organic electronic element is an organic electroluminescence element.

4. A manufacturing method for a display, comprising the step of forming an image display portion, wherein the organic electronic element produced by the method of claim 1 is formed as an image display portion.

\* \* \* \* \*